United States Patent
Wang

(10) Patent No.: US 8,250,449 B2
(45) Date of Patent: Aug. 21, 2012

(54) DECODING METHOD FOR LDPC CODE BASED ON BP ARITHMETIC

(75) Inventor: Jinshan Wang, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 620 days.

(21) Appl. No.: 12/521,480

(22) PCT Filed: Apr. 11, 2007

(86) PCT No.: PCT/CN2007/001175
§ 371 (c)(1),
(2), (4) Date: Jun. 26, 2009

(87) PCT Pub. No.: WO2008/080272
PCT Pub. Date: Jul. 10, 2008

(65) Prior Publication Data
US 2010/0318872 A1   Dec. 16, 2010

(30) Foreign Application Priority Data

Dec. 29, 2006 (CN) .......................... 2006 1 0167367

(51) Int. Cl.
*H03M 13/03* (2006.01)
(52) U.S. Cl. ................. 714/794; 714/752; 714/758
(58) Field of Classification Search .............. 714/752, 714/758, 794
See application file for complete search history.

(56) References Cited

U.S. PATENT DOCUMENTS

| 7,996,746 B2 * | 8/2011 | Livshitz et al. ............... 714/758 |
| 2006/0136799 A1 | 6/2006 | Choi et al. |
| 2007/0089019 A1 * | 4/2007 | Tang et al. .................... 714/752 |
| 2008/0077843 A1 * | 3/2008 | Cho et al. ...................... 714/801 |

FOREIGN PATENT DOCUMENTS

| CN | 1852029 A | 10/2006 |
| EP | 1696574 A1 | 8/2006 |

* cited by examiner

*Primary Examiner* — Sam Rizk
(74) *Attorney, Agent, or Firm* — Woodcock Washburn LLP

(57) ABSTRACT

A decoding method for LDPC codes based on BP algorithm, includes initializing LLR ($q_{mm}$) with the received LDPC bit stream; updating the check node LLR ($r_{mm}$) and variable node LLR ($q_{mm}$): after updating the LLR ($r_{mm}$) corresponding to nonzero elements in each row in check matrix H in each iteration; immediately updating the LLR ($q_{mm}$) corresponding to all the nonzero elements in the column which has a nonzero element in the row, and repeating the updating row by row; updating LLR ($q_n$) on the basis of LLR ($r_m$); terminating decoding process if maximum number of allowed iterations is reached or the correct result obtained and outputting the final decoding result $x_n$; The method of the present invention may accelerate the decoding convergence, and reduce the number of iterations to increase the throughput, further reduce the power consumption and silicon area of decoding apparatus possible if LLR ($q_{mm}$) is properly approximated.

9 Claims, 7 Drawing Sheets

DECODING METHOD FOR LDPC CODE BASED ON BP ARITHMETIC

TECHNICAL FIELD

The present invention relates to an encoding and decoding method for digital signals, and more specifically, to a decoding method for LDPC based on BP algorithm.

BACKGROUND

Low density parity check (LDPC) code is a kind of linear block codes defined by very sparse parity matrix or bipartite graph, and since it is firstly discovered by Gallager, it is also called Gallager code. After decades of silence, with the development of computer hardware and the relative theory, MacKay and Neal rediscovered it and demonstrated that it has the property of approaching to the Shannon limit. The latest research shows that the LDPC code has the following advantages: LDPC code with a long code length can implement non-error transmission in the condition of extremely low signal to noise ratio, and it has the property of approaching to the Shannon limit; LDPC codes are usually decoded using BP algorithm, and the decoding complexity is proportional to the number of non-zero elements in the parity matrix, and the number of non-zero elements in the parity matrix is proportional to the code length, and thus for the LDPC with long code length, linear-time complexity decoding can be implemented and the approach to Shannon limit not only exists but also can be implemented; The BP algorithm has inherent parallelism, and thus it can be implemented with high parallel structure and can achieve very high decoding throughout.

The BP arithmetic uses the following log likelihood ratios:

$$LLR(c_n) = \log\frac{Pr(x_n = +1 \mid y_n)}{Pr(x_n = -1 \mid y_n)}$$

$$LLR(r_{mn}) = \log\frac{r_{mn}^0}{r_{mn}^1}$$

$$LLR(q_{mn}) = \log\frac{q_{mn}^0}{q_{mn}^1}$$

$$LLR(q_n) = \log\frac{q_n^0}{q_n^1}$$

And the standard BP algorithm in log domain specifically comprises:

(1) Initializing: initializing LLR ($q_{mn}$) according to the following equation:

For $n = 0, \ldots, N-1$
    For $m = 0, \ldots, M-1$
        $LLR(q_{mn}) = \log(q_{mn}^0/q_{mn}^1) = LLR(c_n) = 2y_n/\sigma^2$
    End
End (2) Upgrading the check node: upgrading the LLR($r_{mn}$) according to the following equation:

For $m = 0, \ldots, M-1$
    For $n \in N(m)$ $$LLR(r_{mn}) = \left(\prod_{n' \in N(M)\backslash n} \alpha_{mn'}\right)\Phi\left(\sum_{n' \in N(M)\backslash n} \Phi(\beta_{min'})\right)$$

End
End

Where:

$\alpha_{min'} = \text{sign}(LLR(q_{mn'}))$ $\beta_{min'} = |LLR(q_{mn'})|$ $\Phi(x) = -\log(\tanh(x/2)) = \log\frac{e^x + 1}{e^x - 1}$ (3) Updating the variable node: updating LLR($q_{mn}$) according to the following equation:

For $n = 0, \ldots, N-1$
    For $m \in M(n)$ $$LLR(q_{mn}) = LLR(c_n) + \sum_{m' \in M(n)\backslash m} LLR(r_{m'n})$$

End
End (4) Updating LLR($q_n$): updating LLR($q_n$) according to the following equation:

For $n = 0, \ldots, N-1$ $$LLR(q_n) = LLR(c_n) + \sum_{m \in M(n)} LLR(r_{mn})$$

End (5) Iteration termination judgment: performing hard decisions for the decoded output data according to the following equation:

For $n = 0, \ldots, N-1$
    If $(LLR(q_n) > 0)$
        $\hat{x}_n = 0$
    Else
        $\hat{x}_n = 1$
End In this step, if the condition of $H\hat{x}^T = 0$ is satisfied or the maximal number of iterations has been reached, terminating the whole decoding process, otherwise, proceeding to (2) to continue the process of iteration.

This standard BP algorithm iteratively decodes between the check node LLR($r_{mm}$) and the variable node LLR($q_{mm}$), in which, the number of iterations is relatively large, the calculation is relatively complicated, and for the mobile terminal, its silicon area and power cost are relatively large, thus not good for reducing the size of terminal and extending the using time of the battery.

SUMMARY OF THE INVENTION

In respect to the disadvantage and shortcomings in the prior art, the present invention offers a decoding method for LDPC codes based on BP algorithm, which can speed up the decoding convergence and decrease the number of iterations, further simplify the calculation and so as to decrease the complexity.

In order to achieve the above object, the present invention offers a decoding method for LDPC codes based on BP algorithm, which performs iteratively decoding between the check node LLR($r_{mn}$) and the variable node LLR($q_{mn}$) and comprises the following steps:

110) Initializing LLR ($q_{mn}$) using the received LDPC encoded bit stream;

120) Updating the check node LLR ($r_{mn}$) and variable node LLR ($r_{mn}$): after updating the LLR ($r_{mn}$) corresponding to nonzero elements in each row in check matrix H, immediately updating the LLR ($r_{mn}$) corresponding to all the nonzero elements in the column which corresponds to each of the nonzero elements in the row, and repeating the update row by row;

130) Updating LLR ($q_n$) on the basis of LLR ($r_{mn}$);

140) processing iteration termination judgment according to a maximum number of allowed iterations or whether the equation $H\hat{x}^T=0$ is satisfied, and outputting the final decoding result $x_n$;

wherein $q_{mn}$ is extra-decoding information, $q_n$ is a bit likelihood ratio, $r_{mm}$ is extrinsic information, LLR is a log likelihood ratio and $\hat{x}_n$ is a corresponding decision result of LLR ($q_n$). Furthermore, the method applies simplified decoding algorithm to alleviate the heavy computational burden:

(1) Using the equation $$\Phi\left(\sum_i \Phi(\beta_i)\right) = A \times \min_i(\beta_i), \beta_i > 0, 1 > A > 0 \not\approx \Phi\left(\sum_i \Phi(\beta_i)\right)$$

to perform simplified calculation, and specifically, in said step 120), performing updating according to the following pseudo code:

For $m = 0, \ldots, M - 1$

For $n \in N(m)$ $LLR(r_{mn}) =$

For $m = 0, \ldots, M - 1$

For $n \in N(m)$ $$LLR(r_{mn}^{(k)}) = \left(\prod_{n' \in N(M)\backslash n} \text{sign}\left(LLR(q_n) - LLR(r_{mn'}^{(k-1)})\right) \times \right.$$

$$A \times \min_{n' \in N(M)\backslash n}\left(|LLR(q_n) - LLR(r_{mn'}^{(k-1)})|\right)$$

-continued $$\left(\prod_{n' \in N(M)\backslash n} \alpha_{mn'}\right) \times A \times \min_{n' \in N(M)\backslash n}(\beta_{mn'})$$

End

For $n \in N(m)$ $$LLR(q_{mn}) = LLR(c_n) + \sum_{m' \in M(n)\backslash m} LLR(r_{m'n})$$

End

End

Where,
$\alpha_{mn}=\text{sign}(LLR(q_{mn'}))$, $\beta_{mn'}=|LLR(q_{mn'})|$; $N(m)=\{n:H_{mn}=1\}$ means the set of the subscripts of all bits joining in the mth check function; $M(n)=\{m:H_{mn}=1\}$ means the set of all check functions joined by the $n^{th}$ bit; $N(m)\backslash n$ means the set of subscripts of all bits joining in the mth check function except the nth bit; $M(n)\backslash m$ means the set of all check functions joined by the $n^{th}$ bit except the $m^{th}$ check function;

$$LLR(c_n) = \log\frac{Pr(x_n = +1 \mid y_n)}{Pr(x_n = -1 \mid y_n)},$$

where $y_n$ is the channel output soft information obtained on the basis of the received LDPC encoded bit stream at the time instant n, A is a constant which is determined through simulation.

(2) using $y_n$ to approximately replace $2y_n/\sigma^2$, in said step 110), specifically performing initializing according to the following pseudo code:

For $n = 0, \ldots, N - 1$ $LLR(q_n) = y_n$

For $m = 0, \ldots, M - 1$ $LLR(q_{mn}) = y_n$ $LLR(r_{mn}) = 0$

End

End

Where, $y_n$ is the channel output soft information at the time instant n, $\sigma^2$ is the channel noise variance.

Furthermore, using the equation $LLR(q_{mn})=LLR(q_n)-LLR(r_{mn})$ to simplify the storage of $LLR(q_{mn})$ so as to reduce the required memory, in said steps 120) and 130), specifically performing the updating according to the following pseudo code:

-continued

End

For $n \in N(m)$ $$LLR(q_n) = LLR(q_n) - LLR(r_{mn}^{(k-1)}) + LLR(r_{mn}^{(k)})$$

End

End

Furthermore, it is suitable to simultaneously support several communication standards: said check matrix is one of several LDPC basic matrices corresponding to a plurality of different communication standards and bit rates, this LDPC code decoding method uses several LDPC basic matrices, and also includes selecting one matrix corresponding to said received LDPC encoded bit stream from those several LDPC basic matrices and performing decoding.

Said communication standards includes but not limits to Mobile TV standard or IEEE standards, wherein each communication standard may have one or more code rates.

Compared with the decoding method corresponding to the present standard BP algorithm, the LDPC code decoding method based on BP algorithm offered by the present invention has the following advantages:

(1) After updating the LLR ($r_{mn}$) corresponding to nonzero elements in each row in check matrix H in each iteration, immediately updating the LLR ($q_{mn}$) corresponding to all the nonzero elements in the column which corresponds to each of the nonzero elements in the row, which can speed up the decoding convergence, reduce the number of iterations to increase the throughout, in the case of the best condition, it only needs a half number of iterations compared with the other decoding methods corresponding to the standard BP algorithm;

(2) directly using the channel soft information $y_n$ to initialize the log likelihood ratio of the code bits without the channel noise variance $\sigma^2$, that is, there is no need to estimate the signal to noise ratio corresponding to the codeword;

(3) Approximating the $$\Phi\left(\sum_i \Phi(\beta_i)\right)$$

to reduce the computation complexity;

(4) Calculating and obtaining LLR($q_{mn}$) according to LLR ($q_{mn}$)=LLR($q_n$)−LLR($r_{mn}$) instead of storing it directly, thus reducing the number of storage units and the complexity.

The mobile terminals applying the method of the present invention can effectively decrease the power consumption and the silicon area of the decoding apparatus, it can high-efficiently achieve the decoding of LDPC code which supports multi-protocol standard with high speed by combining with several available basic matrices H, meanwhile, it is good for reducing the size of the terminal and extending the using time of the battery.

BRIEF DESCRIPTION OF DRAWINGS

The present invention will be described in detail with reference to the accompanying figures and the specific implementation.

PREFERRED IMPLEMENTATION OF THE PRESENT INVENTION

The present invention will be described in further detail in combination with hardware apparatus applying the method of the present invention.

The LDPC code in IEEE 802.16e is defined by five basic matrices. LDPC code in IEEE 802.16e comprises 4 code rates: ½, ⅔, ¾ and ⅚, wherein each of code rate ½ and code rate ⅚ have only one basic matrix, while each of code rate ⅔ and code rate ¾ have two basic matrices. For each code rate, the LDPC code in IEEE 802.16e has 19 different code lengths which range from 576 to 2304, and the step is 96, respectively corresponding to 6 to 24 sub-channels in QPSK modulation. The Mobile TV standard and IEEE 802.11n standard also employ LDPC code, whose basic matrix is different from that of the LDPC codes in IEEE 802.16e, but the apparatus of the present invention can implement the decoding of LDPC codes of different basic matrices. LDPC basic matrix in IEEE 802.16e has 24 columns.

Figure 1:
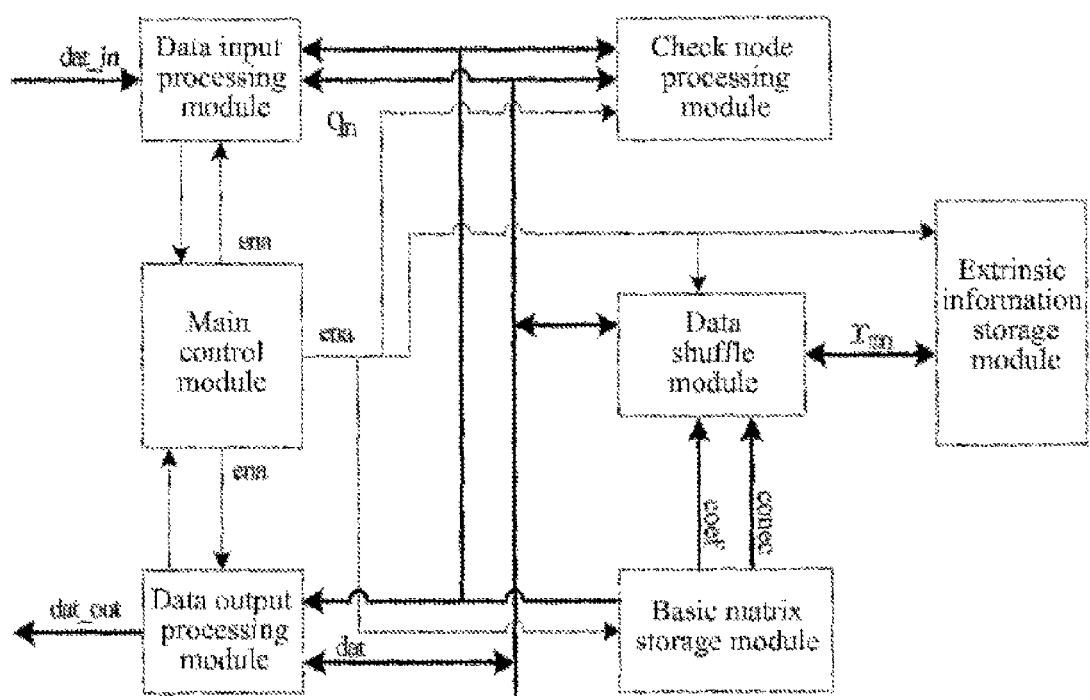
FIG. 1 is a structural diagram of the LDPC decoding apparatus which supports multi-protocol standard in accordance with the present invention.

The function and connection of each module in the apparatus of the present invention which supports multi-protocol standard to decode LDPC codes is shown as FIG. 1: mainly comprising the data input processing module, the data shuffle module, the check node processing module, the extrinsic information storage module, the main control module, the basic matrix storage module and the data output processing module; For the connection lines among the modules in FIG. 1, thick line represents the data bus and the thin line represents the control signal.

Wherein, the data input processing module is used to store the ping-pong RAM array of the bit likelihood ratio, including the input interface of the LDPC decoding apparatus;

The data shuffle module is used to perform the data shuffle function between the RAM read-write data and the check node processing module, and to make hard decision on the bit likelihood information before sending them to the data output processing module;

The check node processing module is used to calculate the corresponding extrinsic information $r_{mn}$ according to the bit likelihood ratio $q_n$ and the decoding extrinsic information $q_{mn}$, and calculate the new $q_{mn}$ with modified min-sum algorithm, and use the new $q_{mn}$ to calculate the new $q_n$;

The extrinsic information storage module is used to store the extrinsic information $r_{mn}$ during the decoding process;

The basic matrix storage module is used to store several kinds of information of the basic matrix;

The data output processing module is used to store the output ping-pong RAM array for outputting the hard decision bits and packet the decoded data;

The main control module is used to generate suitable control signals according to the condition of the data input/output ping-pong buffer and the parameters of the data packet, and the control signals are used to control the operation of the basic matrix storage module, the data input processing module, the extrinsic information storage module, the check node processing module and the data output processing module.

The main control module reads out the basic matrix data from the basic matrix storage module row by row, especially the cyclic shift coefficients (to determine the generation of the RAM read-write address) and the connection between the cyclic shift coefficients (to determine the connection of the data shuffle network), enables the data input processing module and the extrinsic information storage module, the input data dat_in is sent to the data input processing module, and the main control module reads out data $q_n$ and $r_{mn}$ from the memories of the data input processing module and the extrinsic information storage module and send them to the check node processing module through the data shuffle module to be decoded. After a complete iteration is performed, the main control module determines whether the check is passed or it reaches the maximum number of allowed iterations, if yes, stops the iteration and outputs the present data, otherwise, sends out an enabling signal and starts a new iteration. After the decoding iteration is completed, the decoding result is sent to the data output processing module which will send the decoding result dat-out out.

Figure 2:
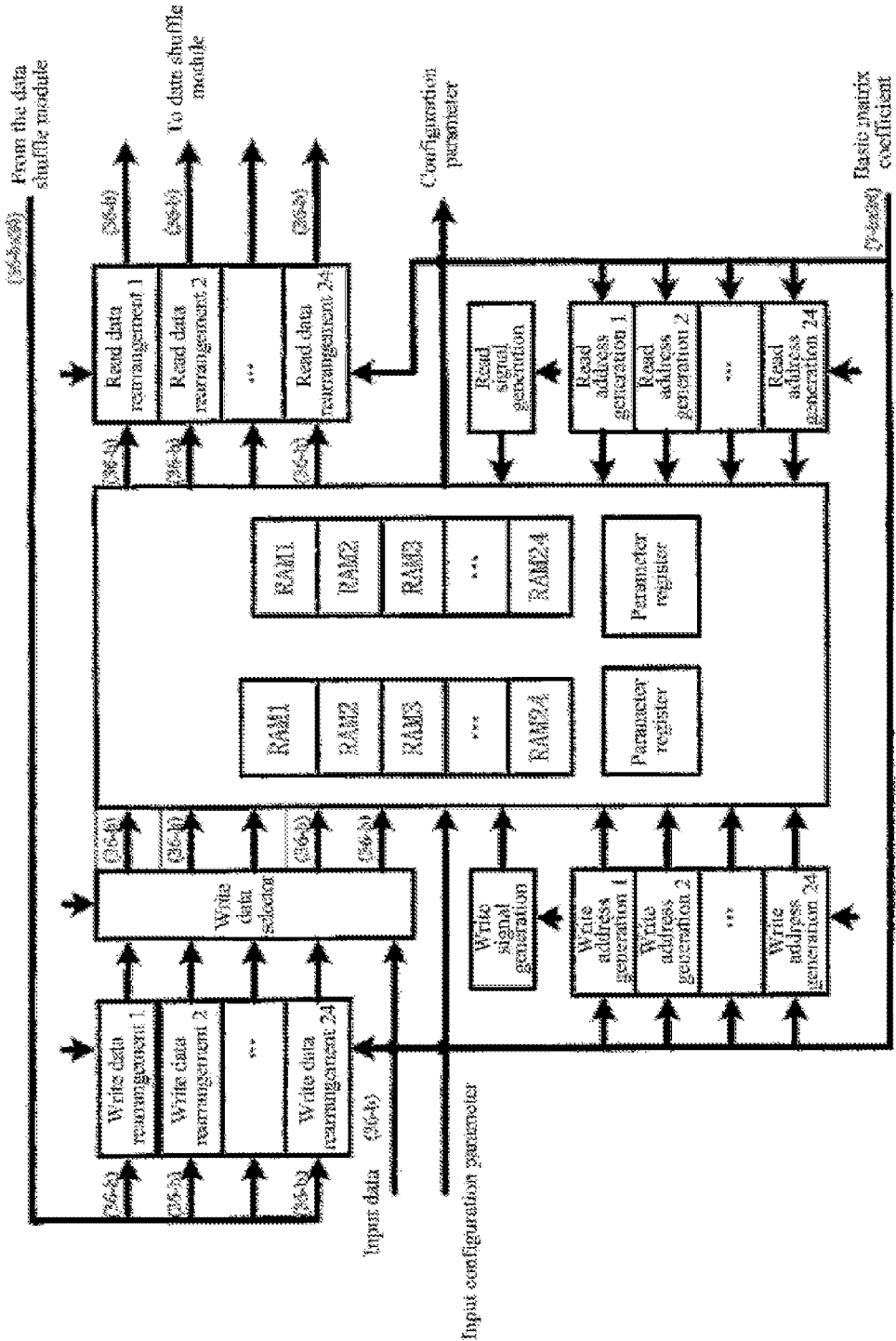
FIG. 2 is a structural diagram of the data input processing module in the apparatus in accordance with the present invention.

As shown in FIG. 2, the main function of the structure of the data input processing module is as follows:

It is mainly a ping-pong RAM array for storing the bit likelihood ratios, including the input interface of the LDPC decoding apparatus. In order to make the input and output of the decoding apparatus smooth, ping-pong buffer is used at the decoding input port, and receive the data input of the next frame when processing the present frame. The data input of the decoding apparatus is the bit likelihood ratio, and the input interface data width is 32-b, and four bit likelihood ratios can be input at one time. Applying the ping-pong RAM array can increase the throughout.

The size of each RAM is (36×96/4)×b=864–b. The parameter register in FIG. 2 needs to store the configuration parameters corresponding to each data packet.

Each WORD in RAM stores 4 bit likelihood ratios, and every time it should read and write according to the WORD. The check node processing module processes 4 rows simultaneously at one time, and each cycle should continually read out 4 bit likelihood ratios from each RAM, and because of the randomness in cyclic shift coefficient of the basic matrix, the start address of the continuous 4 bit likelihood ratios in the WORD is random, thus it is maybe need to read out the data in disjoined WORDs, and it needs to merge the data read out from the two WORDs. In order to realize this functionality, each RAM is added with a 36-bit data read-write alignment unit. The data read-write alignment unit does not work when inputting the interface data and works only in decoding mode.

Figure 3:
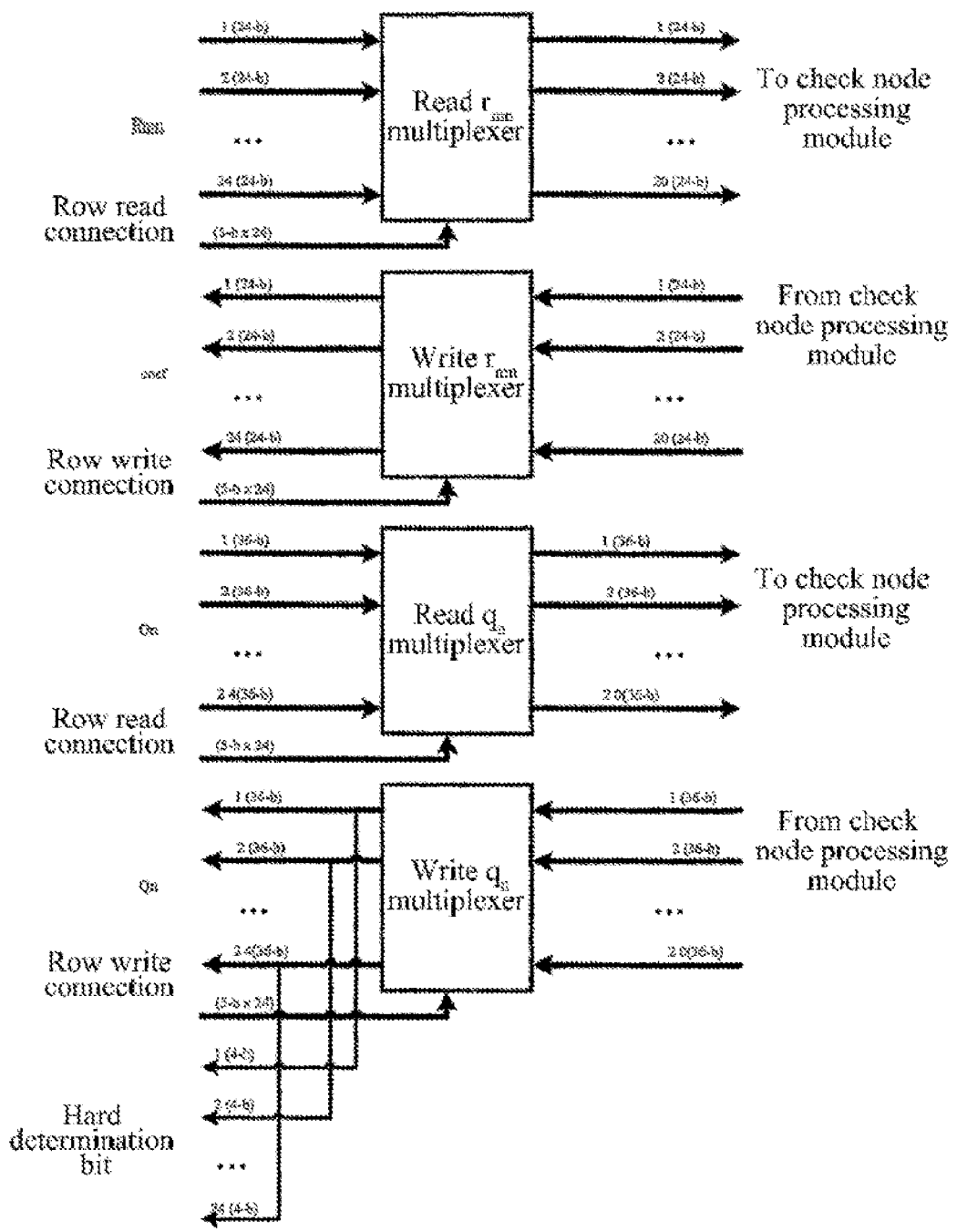
FIG. 3 is a structural diagram of the data shuffle module in the apparatus in accordance with the present invention.

As shown in FIG. 3, the main function of the data shuffle module is as follows:

The data shuffle module performs the function of data shuffle between the RAM read-write data and the check node processing module, and makes hard decisions on the shuffled bit likelihood ratios before sending them to the data output module. The data shuffle network is configured by the matrix row connection coefficient read out from the basic matrix ROM.

The consumed resources (the number of switches) is 24×20×24×4=46080, this number is based on all-connection switching matrix, and actually, many connections will not be used according to the present matrix, and the required switches should be configured according to the practical connections in terms of the basic matrix so as to save resources.

The data shuffle module is configured according to the maximum row weight (20) of the IEEE 802.16e basic matrix. The row weight may not be reached in specific application, at this time, the idle $q_n$ is set to the maximum value, $q_{mn}$, is set to 0, and therefore, they will not affect the decoding result of the min-sum algorithm. In order to support the LDPC codes of multi-protocol, the data shuffle module can be configured according to the maximal row weight of the basic matrix in each protocol.

Figure 4:
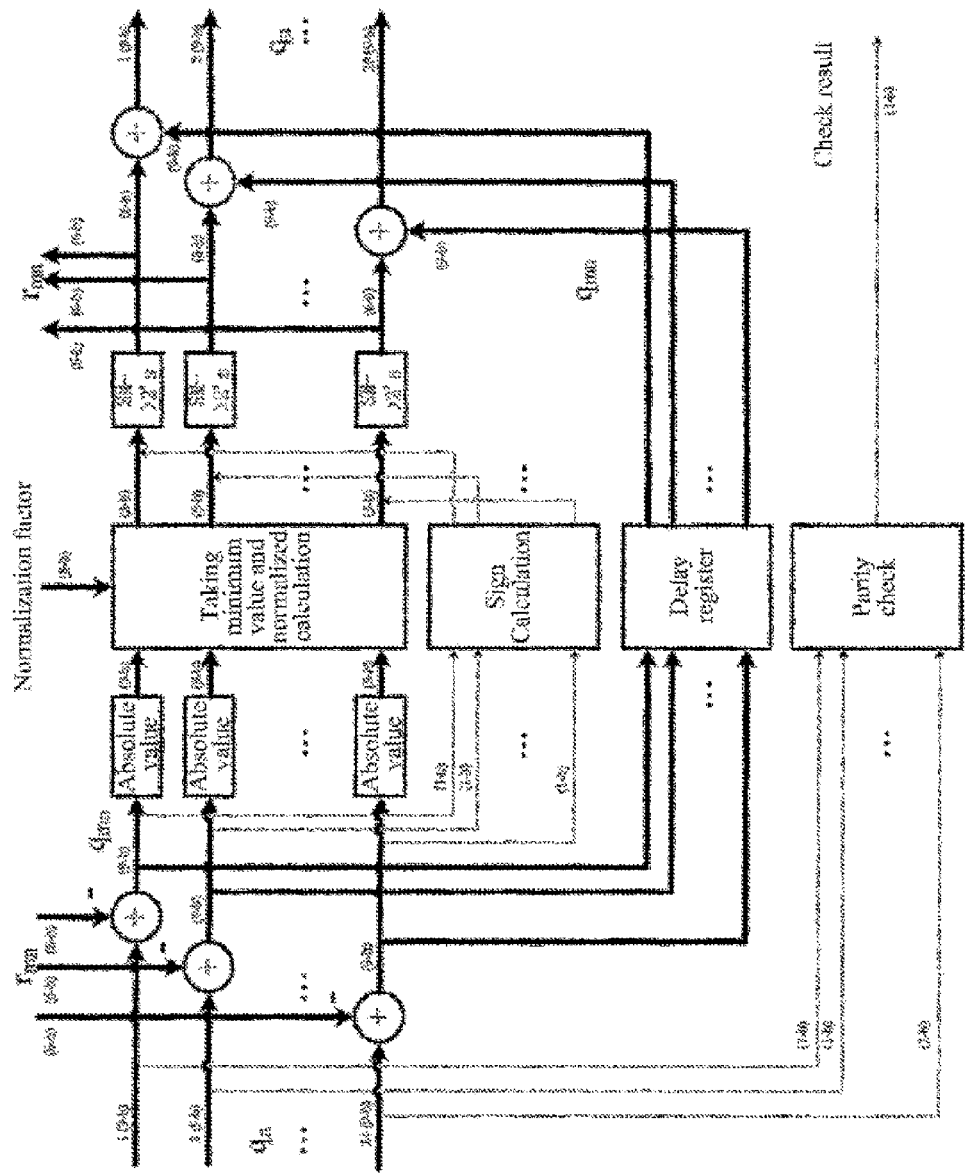
FIG. 4 is a diagram of the circuit implementation of the check node processing unit in the apparatus in accordance with the present invention.

As shown in FIG. 4, the main function of the check node processing module is as follows:

Use the bit likelihood ratio $q_n$ and the extra-decoding information $q_{mn}$, to calculate the corresponding extrinsic information $r_{mn}$, and use layered modified min-sum algorithm to calculate the new $q_{mn}$, and then use the new $q_{mn}$, to calculate the new $q_n$. The standard decoding algorithm for the LDPC codes is belief propagation (BP) algorithm, that is, the message passing algorithm based on encoding bipartite graph, and this arithmetic is based on defining the LDPC parity matrix H(m×n), where n is the LDPC code length and m is the number of check bits.

The present invention applies the layered modified min-sum algorithm to calculate the new $q_{mn}$, and use the new $q_{mn}$, to calculate the new $q_n$, which has three differences compared with the standards BP arithmetic in log domain:

1. Directly use the channel soft information $y_n$ to initialize the log likelihood ratio of the code bits without the need for the channel noise variance $\sigma^2$, thus without the need for estimating the channel signal to noise ratio corresponding to the codeword;

2. Use the following equation to approximate the value of $$\Phi\left(\sum_i \Phi(\beta_i)\right)$$

to reduce computational complexity:

$$\Phi\left(\sum_i \Phi(\beta_i)\right) = A \times \min_i(\beta_i), \beta_i > 0, 1 > A > 0$$

Where, $$\Phi(x) = -\log(\tanh(x/2)) = \log\frac{e^x + 1}{e^x - 1},$$

and the constant A is related to the row weight of the check matrix H, and its value range is 0.6~0.9, and the exact value should be determined through simulation.

3. In iteration, after updating the $LLR(r_{mn})$ corresponding to the non-zero elements in each row in H matrix, update the $LLR(q_{mn})$ corresponding to all non-zero elements in the column corresponding to each non-zero element in the row, and then decode the next row in the H matrix. Compared with standard BP algorithm, this algorithm can speed up the decoding convergence, reduce the number of iterations to increase the throughout, and can cut off a half number of iterations in the case of the best condition.

The layered modified min-sum algorithm specifically comprises:

(1) Initializing $LLR(q_{mn})$ according to the following pseudo code:

For $n = 0, \ldots, N - 1$ $LLR(q_n) = y_n$

For $m = 0, \ldots, M - 1$ $LLR(q_{mn}) = y_n$ $LLR(r_{mn}) = 0$

End

End

Where, $y_n$ is the channel soft information, $q_{mn}$ is the extra-decoding information, $q_n$ is the bit likelihood ratio; $r_{mn}$ is the extrinsic information, $LLR(q_{mn})$ is the log likelihood ratio of $q_{mn}$; $LLR(q_n)$ is the log likelihood ratio of $q_n$; $LLR(r_{mn})$ is the log likelihood ratio of $r_{mn}$.

(2) Updating the check node and the variable node: updating $LLR(r_{mn})$ according to the following pseudo code:

For $m = 0, \ldots, M - 1$

For $n \in N(m)$ $LLR(r_{mn}) = \left(\prod_{n' \in N(M)\backslash n} \alpha_{mn'}\right) \times A \times \underset{n' \in N(M)\backslash n}{\mathrm{Min}}(\beta_{mn'})$ End For $n \in N(m)$ $LLR(q_{mn}) = LLR(c_n) + \sum_{m' \in M(n)\backslash m} LLR(r_{m'n})$ End End Where:
$\alpha_{mn} = \mathrm{sign}(LLR(q_{mn}))$
$\beta_{mn} = |LLR(q_{mn})|$
A: const, 0.0<A<1.0
$N(m) = \{n : H_{mn} = 1\}$ represents the set of all bit subscripts joining in the $m^{th}$ check function;

$M(n) = \{m : H_{mn} = 1\}$ represents the set of all check functions joined by the $n^{th}$ bit;
$N(m)\backslash n$ means the set of subscripts of all bits joining in the $m^{th}$ check function except the $n^{th}$ bit;
$M(n)\backslash m$ means the set of all the check functions joined by the $n^{th}$ bit except the $m^{th}$ check function;
$y_n$ is the channel output soft information at the time instant n;
$x_n$ is the codeword sent at the time instant n;

$$LLR(c_n) = \log\frac{Pr(x_n = +1 \mid y_n)}{Pr(x_q = -1 \mid y_n)}$$

$q_{mn}$ is the extra-decoding information, $r_{mn}$ is the extrinsic information; $LLR(r_{mn})$ is the log likelihood ratio of $r_{mn}$; $LLR(q_{mn})$ is the log likelihood ratio of $q_{mn}$.

(3) Updating $LLR(q_n)$ according to the following pseudo code:

For $n = 0, \ldots, N - 1$ $LLR(q_n) = LLR(c_n) + \sum_{m \in M(n)} LLR(r_{mn})$ End (4) Iteration termination judgment: hard decision on the decoding output according to the following pseudo code:

For $n = 0, \ldots, N - 1$

If $(LLR(q_n) > 0)$ $\hat{x}_n = 0$

Else $\hat{x}_n = 1$

End

Where, $\hat{x}_n$ the decoding output hard decision, $q_n$ is the bit likelihood ratio, and $LLR(q_n)$ is the log likelihood ratio of $q_n$.

If the condition of $H\hat{x}^T = 1$ is satisfied or the maximum number of allowed iterations is reached, terminating the whole decoding process, otherwise, proceeding to (2) to continue the process of iteration.

During the implementation, in order to decrease the complication, the above arithmetic should be transformed, and $LLR(q_{mn})$ is not directly stored, and it should be computed according to the following equation:

$LLR(q_{mn}) = LLR(q_n) - LLR(r_{mn})$

And new processing procedures after transformation are as follows:

(11) Initializing $LLR(q_n)$ and $LLR(r_{mn})$ according to the following pseudo code:

For $n = 0, \ldots, N - 1$ $LLR(q_n) = y_n$

For $m = 0, \ldots, M - 1$ $LLR(r_{mn}) = 0$

-continued

```
    End
End
```

(12) Updating the check node and bit soft information: updating LLR($r_{mn}$) and LLR($q_n$) according to the following pseudo code:

For $m = 0, \ldots, M - 1$

For $n \subset N(m)$ $$LLR(r_{mn}^{(k)}) = \left(\prod_{n' \in N(M) \setminus n} \text{sign}(LLR(q_n) - LLR(r_{mn'}^{(k-1)}))\right) \times$$

$$A \times \min_{n' \in N(M) \setminus n} (|LLR(q_n) - LLR(r_{mn'}^{(k-1)})|)$$

End

For $n \in N(m)$ $$LLR(q_n) = LLR(q_n) - LLR(r_{mn}^{(k-1)}) + LLR(r_{mn}^{(k)})$$

End

End

Where:
A: const, 0.0<A<1.0
k: the $k^{th}$ iteration;

(13) The iteration termination judgment: hard decision on the decoding output according to the following pseudo code:

For $n = 0, \ldots, N - 1$

If ($LLR(q_n) > 0$)

$\hat{x}_n = 0$

Else $\hat{x}_n = 1$

End

If the condition of $H\hat{x}^T = 0$ is satisfied or the maximum number of allowed iterations is reached, terminating the whole decoding process, otherwise, proceeding to (2) to continue the process of iteration.

The difference between the layered decoding algorithm and the standard BP arithmetic is: in iteration, after updating the LLR($r_{mn}$) corresponding to the non-zero elements in each row in H matrix, update the LLR($q_{mn}$) corresponding to all non-zero elements in the column corresponding to each non-zero element in the row, and then decode the next row in the H matrix. Compared with standard BP algorithm, this algorithm can speed up the decoding convergence, reduce the number of iterations to increase the throughput, and can cut off a half number of iterations in the case of the best condition.

The check node processing module comprises four child check node processing units, that is, the module can parallel process four rows in the LDPC parity matrix at one time. The diagram of the circuit implementation of the check node processing unit is shown in FIG. 4. Suppose the working clock of the LDPC decoder is 100 MHz, and four child check node processing units parallel calculate, and the average number of iterations is 7. After calculation, the throughput of the decoder with code length of (2304-b) is 100 Mbps, which meets the requirement of the standards such as IEEE 802.16e, mobile TV and IEEE 802.11n. Further throughput increase can be realized by adding the data parallel processed by the child check node processing units. In all, the throughput of the LDPC decoding apparatus relates to the working clock of the decoding apparatus, the length of the data packet, the average number of iterations of the decoding apparatus, and the amount of parallel calculation by the check node processing unit.

Figure 5:
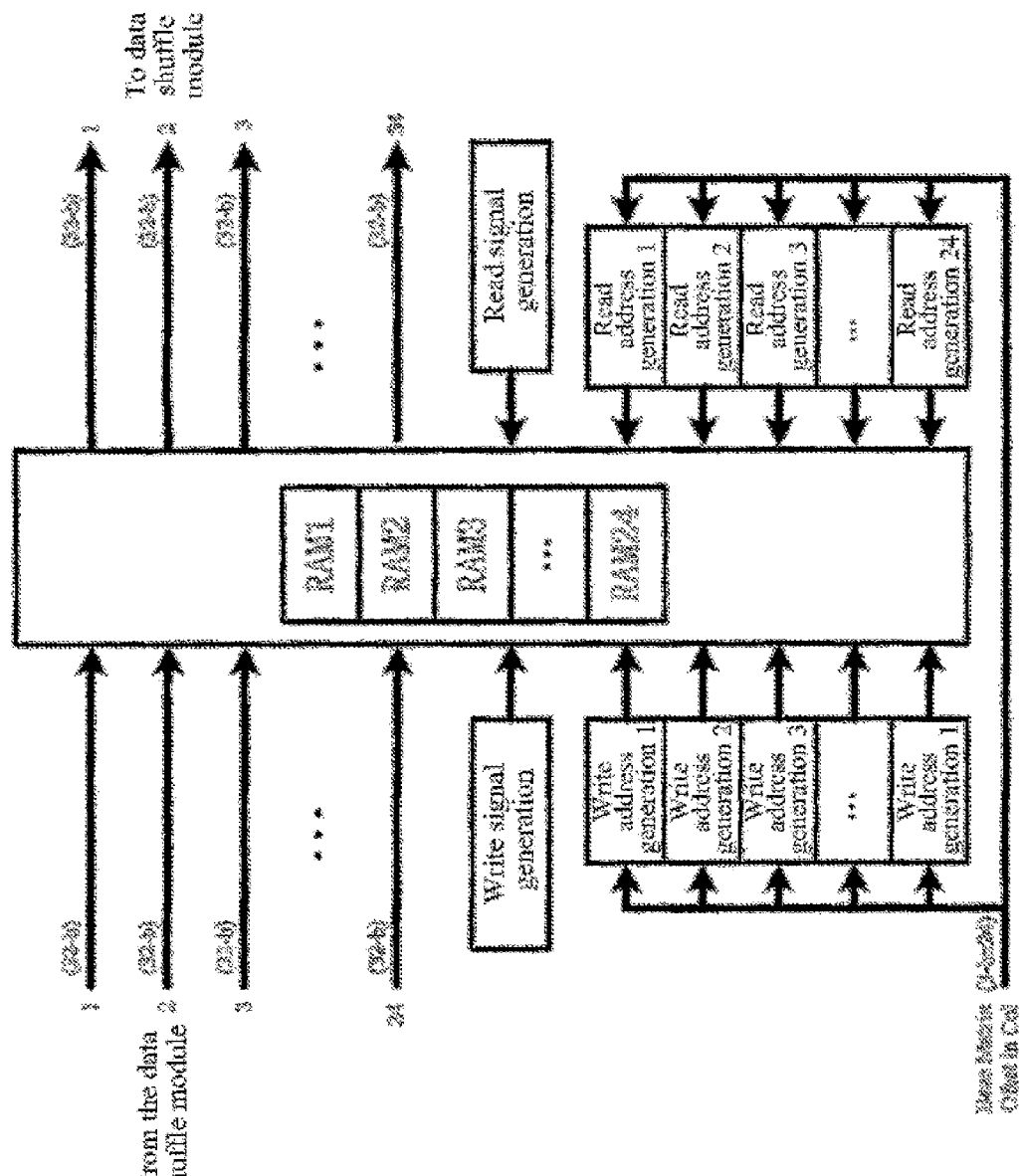
FIG. 5 is a structural diagram of the extrinsic information storage module in the apparatus in accordance with the present invention.

As shown in FIG. 5, the main function of the extrinsic information storage module is to store the extrinsic information $r_{mn}$ used during decoding. The IEEE 802.16e LDPC basic matrix has 24 columns, and thus the extrinsic information RAM totally has 24 blocks, and each block stores a column of extrinsic information. Each RAM is dual-port RAM whose read-write data line width is 32 and is used to store 4 $r_{mn}$s.

The main control module controls the operation of the whole decoder, and it generates a suitable control signal according to the condition of the data input/output ping-pong buffer and the parameters of the data packet. The output control signal will control the operation of the following modules: the data input processing module, the extrinsic information storage module, the basic matrix storage module and the data output processing module.

The main control module will generate all levels of control signals, including the level of data packet (the packet processing start signal, the packet processing end signal), the level of iteration (iteration processing start signal) and layer level (layer processing start signal). Under the control of these signals, the data input processing module reads and writes the bit likelihood information layer by layer, clears the input ping-pong buffer state register; the extrinsic information storage module initializes the extrinsic information storage module (reset to be zero), reads and writes the extrinsic information storage module layer by layer; the basic matrix storage module reads out the information in the basic matrix ROM row by row; the data output processing module writes the hard decision bit layer by layer, resets the output ping-pong buffer register.

Figure 6:
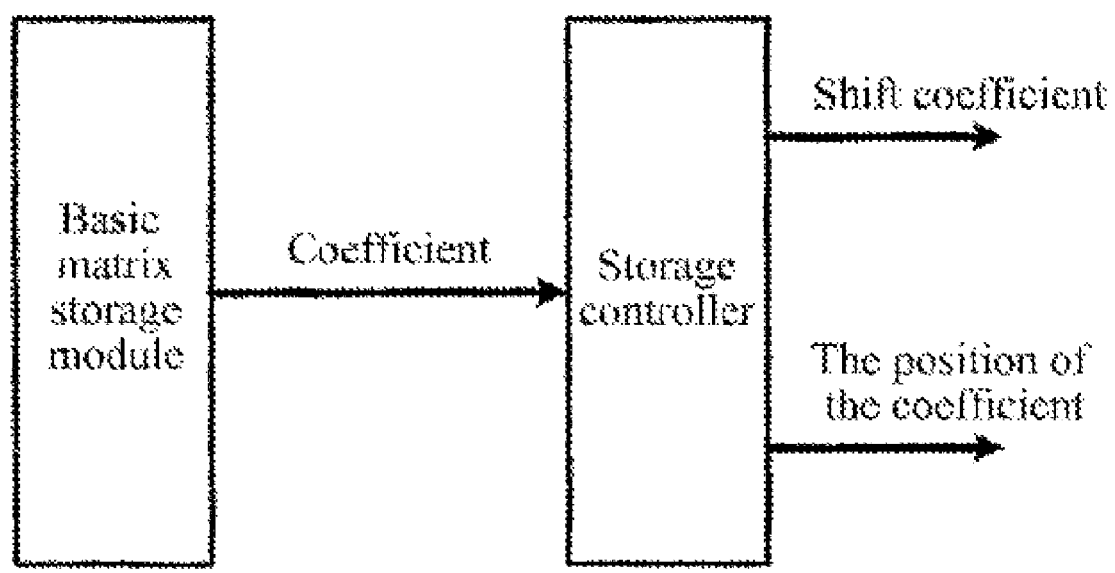
FIG. 6 is a structural diagram of the basic matrix storage module in the apparatus in accordance with the present invention.

As shown in FIG. 6, the main function of the basic matrix storage module is to store several kinds of information about the basic matrix. The basic matrices of LDPC codes of different protocols are different. According to IEEE 802.16e, there are total 6 basic matrices. For each basic matrix, it stores the following information: the basic matrix coefficient (storing all coefficients including−1) which is the $n^{th}$ nonzero coefficient (3-b) in the corresponding column, the connection of the data shuffle module (row-to-row storing and 5-b*2*24 in each row), the decoding correction coefficient corresponding to the basic matrix.

For the coefficient of the basic matrix, the following processing should be performed according to the parameters for the code length after reading out the coefficient from the ROM: for the codes with the code rate being 1/2, 2/3B, 3/4A and B, 5/6, their corresponding shift factors {p(f,i,j)} can be obtained by operating {p(i,j)} according to the following equation:

$$p(f, i, j) = \begin{cases} p(i, j), & p(i, j) \leq 0 \\ \left\lfloor \dfrac{p(i, j) z_f}{z_0} \right\rfloor, & p(i, j) > 0 \end{cases}$$

Where $\lfloor x \rfloor$ means the round-down operation for x.

For the code with the code rate being 2/3A, the corresponding shift factor $\{p(f,i,j)\}$ can be obtained by processing $\{p(i,j)\}$ according to the following equation:

$$p(f, i, j) = \begin{cases} p(i, j), & p(i, j) \le 0 \\ \mod(p(i, j), z_f), & p(i, j) > 0 \end{cases}$$

Where each basic matrix has nb=24 rows, and its extension factor is zf=n/24 when the code length is n. And the subscript f(f=0, 1, 2, . . . 18) corresponds to the index of each code length for each code rate. For the code length of 2304, the extension factor is z0=96.

After calculation, the coefficient and the in-row ROM needs a RAM of 16K, and storing the shuffle coefficient also needs a 16K RAM. The amount of data in the ROM storing the decoding correction coefficient is relatively small, and it can be implemented by combinational logic.

The width of the coefficient ROM is 64-b (two 32-bs), and 6 coefficients and in-column index offset (10b×6 in total) can be read out at one time, and it takes 4 times to read out the 24 coefficients, so as 48 data shuffle indexes.

The readout coefficients are buffered in a two-stage register, the target of setting the two-stage register is that the configuration coefficient of the next layer can be read out concurrently when the configuration coefficient of the current layer is being used, and the current configuration coefficient can be updated when layer handoff.

The basic matrices of LDPC codes of different protocols are different, and increasing the number of basic matrices stored in the basic matrix storage module will provide more support for the LDPC code of new standard.

Figure 7:
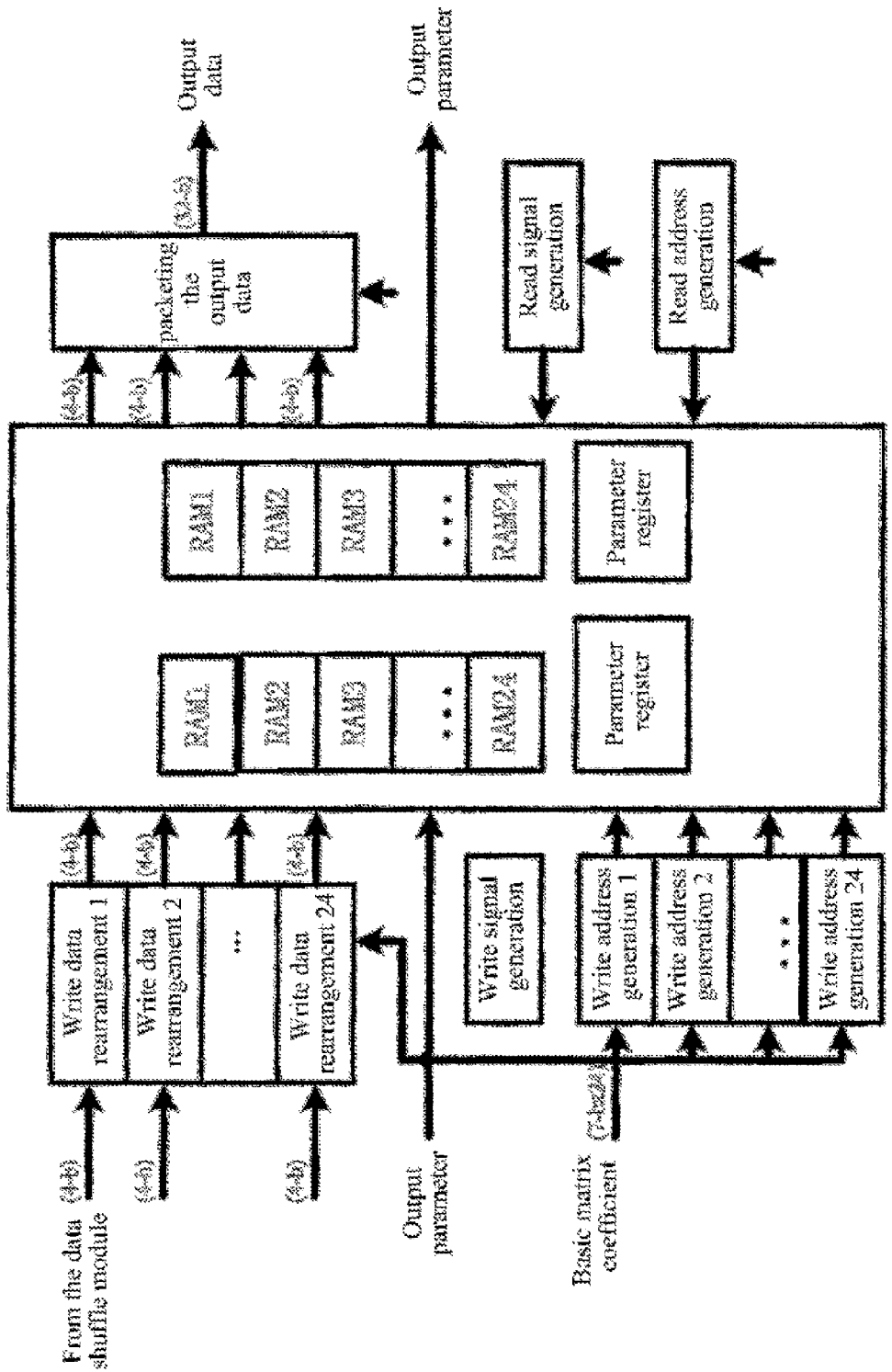
FIG. 7 is a structural diagram of the data output processing module in the apparatus in accordance with the present invention.

As shown in FIG. 7, the data output processing module is mainly an output ping-pong RAM array for storing the output hard decision bit, and it also performs the function of packeting the decoding data. Similar to the data input processing module, it needs to perform 4 bit data alignment when the hard decision data bit is written to the RAM. Since the data bits to be read and written should be buffered and merged, the data read-write alignment unit will consume some registers.

The output ping-pong RAM array can make the decoding process and the data output process independent from each other, and thus they can be processed concurrently. Applying the ping-pong RAM array can increase the throughout. The size of each RAM is 96 bits, and the width of the read-write data is 4-b. The IEEE 802.16e LDPC basic matrix has 24 columns, and it needs 48 RAMs. The RAM read-write address generation should be configured by the basic matrix coefficients read out from the basic matrix storage module row by row. The parameter register in FIG. 7 is used to store decoding result of each data packet.

The present invention applies the layered modified min-sum algorithm, and compared with standard LDPC decoding algorithm (BP algorithm), this algorithm can speed up the decoding convergence, effectively reduce the number of iterations to increase the throughout, and can cut off a half number of iterations in the case of the best condition.

The basic matrix storage module in the apparatus of the present invention can store the basic matrices of different protocols and can perform decoding operation on the basis of the stored basic matrices. Therefore, the apparatus of the present invention can support multi-bit-rate and multi-protocol LDPC codes and effectively decrease the consumed power and the silicon area in the decoding apparatus, thus can high-efficiently implement the decoding of the multi-protocol LDPC codes with high speed.

What is claimed is:

1. A decoding method for low density check codes based on Belief Propagation algorithm, iteratively performing decoding between check nodes LLR($r_{mn}$) and variable nodes LLR ($q_{mn}$) and comprising the following steps of:
   110) initializing LLR ($q_{mn}$) using a received low density parity code bit stream;
   120) updating the check node LLR($r_{mn}$) and variable node LLR ($q_{mn}$): after updating the LLR($r_{mn}$) corresponding to nonzero elements in each row in check matrix H in each iteration, immediately updating the LLR ($q_{mn}$) corresponding to all the nonzero elements in a column which corresponds to the nonzero elements in the row, and repeating the updating row by row;
   130) updating LLR ($q_n$) on the basis of LLR($r_{mn}$);
   140) processing iteration termination judgment according to a maximum number of allowed iterations or whether the equation of $H\hat{x}^T=0$ is satisfied, and outputting the final decoding result $x_n$;
   wherein $q_{mn}$ is extra-decoding information, $q_n$ is a bit likelihood ratio, $r_{mm}$ is extrinsic information, LLR is a log likelihood ratio and $\hat{x}_n$ is a corresponding decision result of LLR($q_n$).

2. A method of claim 1, wherein an equation $$\Phi\left(\sum_i \Phi(\beta_i)\right) = A \times \min_i(\beta_i), \beta_i > 0, 1 > A > 0 \text{对} \Phi\left(\sum_i \Phi(\beta_i)\right)$$

is used to simplify computation, and specifically, in said step 120), updating is performed according to the following pseudo code:

For $m = 0, \ldots, M - 1$
    For $n \in N(m)$
$$LLR(r_{mn}) = \left(\prod_{n' \in N(M)\backslash n} \alpha_{mn'}\right) \times A \times \min_{n' \in N(M)\backslash n}(\beta_{mn'})$$
    End
    For $n \in N(m)$
$$LLR(q_{mn}) = LLR(c_n) + \sum_{m' \in M(n)\backslash m} LLR(r_{m'n})$$
    End
End wherein,
$\alpha_{mn}$=sign(LLR($q_{mn'}$)), $\beta_{mn}$=|LLR($q_{mn'}$)|; —N(m)={n: $H_{mn}$=1} means a set of subscripts of all bits joining in a $m^{th}$ check function; M(n)={m:$H_{mn}$=1} means a set of all check functions joined by a $n^{th}$ bit; N(m)\n means a set of subscripts of all bits joining in the $m^{th}$ check function except the $n^{th}$ bit; m(n)\m means a set of all check functions joined by the $n^{th}$ bit except the $m^{th}$ check function;

$$LLR(c_n) = \log \frac{Pr(x_n = +1 \mid y_n)}{Pr(x_n = -1 \mid y_n)},$$

wherein $y_n$ is channel output soft information obtained on the basis of the received density parity code bit stream at the time instant n, and A is a constant which is determined through simulation.

3. A method of claim 1, wherein $y_n$ is used to approximately replace $2y_n/\sigma^2$, and in said step 110), initialization is specifically performed according to the following pseudo code:

$$\text{For } n = 0, \ldots, N-1$$
$$\quad LLR(q_n) = y_n$$
$$\quad \text{For } m = 0, \ldots, M-1$$
$$\quad\quad LLR(q_{mn}) = y_n$$
$$\quad\quad LLR(r_{mn}) = 0$$
$$\quad \text{End}$$
$$\text{End}$$

wherein, $y_n$ is channel output soft information at the time instant n, and $\sigma^2$ is a channel noise variance.

4. A method of claim 1, wherein in said step 130), updating is specifically performed according to the following pseudo code:

$$\text{For } n = 0, \ldots, N-1$$
$$\quad LLR(q_n) = LLR(c_n) + \sum_{m \in M(n)} LLR(r_{mn})$$
$$\text{End}$$

wherein, $$LLR(c_n) = \log \frac{Pr(x_n = +1 \mid y_n)}{Pr(x_n = -1 \mid y_n)},$$

and $y_n$ is channel output soft information obtained on the basis of the received density parity code bit stream at the time instant n.

5. A method of claim 1, wherein said step 140) comprises hard decision which is performed specifically according to the following pseudo code:

$$\text{For } n = 0, \ldots, N-1$$
$$\quad \text{If } (LLR(q_n) > 0)$$
$$\quad\quad \hat{x}_n = 0$$
$$\quad \text{Else}$$
$$\quad\quad \hat{x}_n = 1$$
$$\text{End}$$

wherein, $\hat{x}_n$ is a hard decision bit, and if $H\hat{x}^T = 0$ is satisfied or a maximum number of allowed iterations has been reached, the whole decoding process is termination; otherwise, proceeding to the step 120) to continue to process of iteration.

6. A method of claim 2, wherein an equation $LLR(q_{mn}) = LLR(q_n) - LLR(r_{mn})$ is used to simplify storage of $LLR(q_{mn})$, and in said steps 120) and 130), the updating is specifically performed according to the following pseudo code:

$$\text{For } m = 0, \ldots, M-1$$
$$\quad \text{For } n \in N(m)$$
$$\quad\quad LLR(r_{mn}^{(k)}) = \left( \prod_{n' \in N(M) \setminus n} \text{sign}(LLR(q_n) - LLR(r_{mn'}^{(k-1)})) \times \right)$$
$$\quad\quad A \times \min_{n' \in N(M) \setminus n} \left( |LLR(q_n) - LLR(r_{mn'}^{(k-1)})| \right)$$
$$\quad \text{End}$$
$$\quad \text{For } n \in N(m)$$
$$\quad\quad LLR(q_n) = LLR(q_n) - LLR(r_{mn}^{(k-1)}) + LLR(r_{mn}^{(k)})$$
$$\quad \text{End}$$
$$\text{End}$$

7. A method of claim 1, wherein said check matrix H is one of several low density parity check code basic matrices corresponding to a plurality of different communication standards and code rates, the low density parity check code decoding method uses several low density parity check basic matrices, and also includes selecting one low density parity check basic matrix corresponding to said received low density parity check encoded bit stream from those several low density parity check basic matrices and performing decoding.

8. A method of claim 7, wherein said communication standard can be Mobile TV standard or IEEE standard.

9. A method of claim 4, wherein an equation $LLR(q_{mn}) = LLR(q_n) - LLR(r_{mn})$ is used to simplify storage of $LLR(q_{mn})$, and in said steps 120) and 130), the updating is specifically performed according to the following pseudo code:

$$\text{For } m = 0, \ldots, M-1$$
$$\quad \text{For } n \in N(m)$$
$$\quad\quad LLR(r_{mn}^{(k)}) = \left( \prod_{n' \in N(M) \setminus n} \text{sign}(LLR(q_n) - LLR(r_{mn'}^{(k-1)})) \times \right)$$
$$\quad\quad A \times \min_{n' \in N(M) \setminus n} \left( |LLR(q_n) - LLR(r_{mn'}^{(k-1)})| \right)$$
$$\quad \text{End}$$
$$\quad \text{For } n \in N(m)$$
$$\quad\quad LLR(q_n) = LLR(q_n) - LLR(r_{mn}^{(k-1)}) + LLR(r_{mn}^{(k)})$$
$$\quad \text{End}$$
$$\text{End}$$

* * * * *

UNITED STATES PATENT AND TRADEMARK OFFICE
CERTIFICATE OF CORRECTION

| | | |
|---|---|---|
| PATENT NO. | : 8,250,449 B2 | |
| APPLICATION NO. | : 12/521480 | |
| DATED | : August 21, 2012 | |
| INVENTOR(S) | : Jinshan Wang | |

It is certified that error appears in the above-identified patent and that said Letters Patent is hereby corrected as shown below:

IN THE CLAIMS:

Column 14, lines 5-26, in Claim 1, delete

"1. A decoding method for low density check codes based on Belief Propagation algorithm, iteratively performing decoding between check nodes LLR($r_{mn}$) and variable nodes LLR ($q_{mn}$) and comprising the following steps of:
   110) initializing LLR ($q_{mn}$) using a received low density parity code bit stream;
   120) updating the cheek node LLR($r_{mn}$) and variable node LLR ($q_{mn}$): after updating the LLR($r_{mn}$) corresponding to nonzero elements in each row in check matrix H in each iteration, immediately updating the LLR ($q_{mn}$) corresponding to all the nonzero elements in a column which corresponds to the nonzero elements in the row. and repeating the updating row by row:
   130) updating LLR ($q_n$) on the basis of LLR($r_{mn}$);
   140) processing iteration termination judgment according to a maximum number of allowed iterations or whether the equation of $Hx^T=0$ is satisfied, and outputting the final decoding result $x_n$;
   wherein $q_{mn}$ is extra-decoding information, $q_n$ is a bit likelihood ratio, $r_{mm}$ is extrinsic information, LLR is a log likelihood ratio and $\hat{x}_n$ is a corresponding decision result of LLR($q_n$)."

and insert

Signed and Sealed this
Fifteenth Day of January, 2013

David J. Kappos
*Director of the United States Patent and Trademark Office*

--1. A decoding method for low density check codes based on Belief Propagation algorithm, iteratively performing decoding between check nodes $LLR(r_{mn})$ and variable nodes $LLR(q_{mn})$ and comprising the following steps of:

110) initializing $LLR\ (q_{mn})$ using a received low density parity code bit stream;

120) updating the check node $LLR(r_{mn})$ and variable node $LLR\ (q_{mn})$: after updating the $LLR(r_{mn})$ corresponding to nonzero elements in each row in check matrix H in each iteration, immediately updating the $LLR\ (q_{mn})$ corresponding to all the nonzero elements in a column which corresponds to the nonzero elements in the row, and repeating the updating row by row;

130) updating $LLR\ (q_n)$ on the basis of $LLR(r_{mn})$;

140) processing iteration termination judgment according to a maximum number of allowed iterations or whether the equation of $H\hat{x}^T = 0$ is satisfied, and outputting the final decoding result $x_n$;

wherein $q_{mn}$ is extra-decoding information, $q_n$ is a bit likelihood ratio, $r_{mn}$ is extrinsic information, $LLR$ is a log likelihood ratio and $\hat{x}_n$ is a corresponding decision result of $LLR(q_n)$.-- therefor.--

Column 14, lines 55-61, in Claim 2, delete

"$\alpha_{mn}$=sign(LLR($q_{mn'}$)), $\beta_{mn'}$= LLR($q_{mn'}$) ; —N(m)={n: $H_{mn}$=1} means a set of subscripts of all bits joining in a $m^{th}$ check function; M(n)={m:$H_{mn}$=1} means a set of all check functions joined by a $n^{th}$ bit; N(m)\n means a set of subscripts of all bits joining in the $m^{th}$ check function except the $n^{th}$ bit; m(n)\m means a set of all check functions joined by the $n^{th}$ bit except the $m^{th}$ check function;"

and insert -- $\alpha_{mn'} = sign(LLR(q_{mn'})), \beta_{mn'} =| LLR(q_{mn'}) |;\ \ N(m) = \{n : H_{mn} = 1\}$ means a set of subscripts of all bits joining in a $m^{th}$ check function; $M(n) = \{m: H_{mn} =1\}$ means a set of all check functions joined by a $n^{th}$ bit; $N(m)\backslash n$ means a set of subscripts of all bits joining in the $m^{th}$ check function except the $n^{th}$ bit; $M(n)\backslash m$ means a set of all check functions joined by the $n^{th}$ bit except the $m^{th}$ check function;-- therefor.

Column 15, line 1, in Claim 2, delete "$y_n$" and insert --$y_n$-- therefor.

Column 15, line 5, in Claim 3, delete "$y_n$" and insert --$y_n$-- therefor.

Column 15, line 6, in Claim 3, delete "$2y_n/\sigma^2$" and insert --$2y_n/\sigma^2$-- therefor.

Column 15, line 21, in Claim 3, delete "$y_n$" and insert --$y_n$-- therefor.

CERTIFICATE OF CORRECTION (continued)
U.S. Pat. No. 8,250,449 B2

Column 15, line 22, in Claim 3, delete "$\sigma^2$" and insert --$\sigma^2$-- therefor.

Column 15, line 38, in Claim 4, delete "$LLR(c_n) = \log\frac{Pr(x_n = +1 \mid y_n)}{Pr(x_n = -1 \mid y_n)}$" and insert -- $LLR(c_n) = \log\frac{Pr(x_n = +1 \mid y_n)}{Pr(x_n = -1 \mid y_n)}$ -- therefor.

Column 15, line 41, in Claim 4, delete "$y_n$," and insert --$y_n$-- therefor.

Column 15, line 58, in Claim 5, delete "$\hat{x}_n$" and insert -- $\hat{x}_n$ -- and delete "$H\hat{x}^T = 0$" and insert -- $H\hat{x}^T = 0$ -- therefor.

Column 16, lines 4-5, in Claim 6, delete "LLR($q_{mn}$)=LLR($q_n$)-LLR($r_{mn}$)" and insert --*LLR($q_{mn}$)=LLR($q_n$)-LLR($r_{mn}$)*-- therefor, and delete "LLR($q_{mn}$)" and insert --*LLR($q_{mn}$)*-- therefor.

Column 16, lines 10-23, in Claim 6, delete

"For $m = 0, \ldots, M - 1$

For $n \in N(m)$ $$LLR(r_{mn}^{(k)}) = \left(\prod_{n' \in N(M) \setminus n} \text{sign}(LLR(q_{n'}) - LLR(r_{mn'}^{(k-1)}))\right) \times$$

$$A \times \min_{n' \in N(M) \setminus n} (|LLR(q_{n'}) - LLR(r_{mn'}^{(k-1)})|)$$

End

For $n \in N(m)$ $$LLR(q_n) = LLR(q_n) - LLR(r_{mn}^{(k-1)}) + LLR(r_{mn}^{(k)})$$

End

End"

and insert $$\text{For } m = 0, \cdots, M-1$$
$$\quad \text{For } n \in N(m)$$
$$\quad\quad LLR(r_{mn}^{(k)}) = \left( \prod_{n' \in N(M) \setminus n} sign(LLR(q_n) - LLR(r_{mn'}^{(k-1)})) \times \right)$$
$$\quad\quad A \times \min_{n' \in N(M) \setminus n} (|LLR(q_n) - LLR(r_{mn'}^{(k-1)})|)$$
$$\quad End$$
$$\quad \text{For } n \in N(m)$$
$$\quad\quad LLR(q_n) = LLR(q_n) - LLR(r_{mn}^{(k-1)}) + LLR(r_{mn}^{(k)})$$
$$\quad End$$
$$End$$

-- therefor.

Column 16, lines 35 and 36, in Claim 9, delete "LLR($q_{mn}$)=LLR($q_n$)-LLR($r_{mn}$)" and insert --*LLR($q_{mn}$)=LLR($q_n$)-LLR($r_{mn}$)*-- therefor, and delete "LLR($q_{mn}$)" and insert --*LLR($q_{mn}$)*-- therefor.

Column 16, lines 44-56, in Claim 9, delete $$\text{For } m = 0, \ldots, M-1$$
$$\quad \text{For } n \in N(m)$$
$$\quad\quad LLR(r_{mn}^{(k)}) = \left( \prod_{n' \in N(M) \setminus n} sign(LLR(q_n) - LLR(r_{mn'}^{(k-1)})) \times \right)$$
$$\quad\quad A \times \min_{n' \in N(M) \setminus n} (|LLR(q_n) - LLR(r_{mn'}^{(k-1)})|)$$
$$\quad End$$
$$\quad \text{For } n \in N(m)$$
$$\quad\quad LLR(q_n) = LLR(q_n) - LLR(r_{mn}^{(k-1)}) + LLR(r_{mn}^{(k)})$$
$$\quad End$$
"End"

and insert $$For \quad m = 0, \cdots, M-1$$
$$\quad For\ n \in N(m)$$
$$LLR(r_{mn}^{(k)}) = \left( \prod_{n' \in N(M) \setminus n} sign(LLR(q_n) - LLR(r_{mn'}^{(k-1)})) \times \right)$$
$$A \times \underset{n' \in N(M) \setminus n}{Min} \left( \left| LLR(q_n) - LLR(r_{mn'}^{(k-1)}) \right| \right)$$
$$End$$
$$For\ n \in N(m)$$
$$LLR(q_n) = LLR(q_n) - LLR(r_{mn}^{(k-1)}) + LLR(r_{mn}^{(k)})$$
$$End$$
$$End$$

-- therefor.